United States Patent
Yu et al.

(10) Patent No.: US 7,418,982 B2
(45) Date of Patent: Sep. 2, 2008

(54) SUBSTRATE CARRIER AND FACILITY INTERFACE AND APPARATUS INCLUDING SAME

(75) Inventors: Chen-Hua Yu, Hsin-Chu (TW); Yi-Li Hsiao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/419,914

(22) Filed: May 23, 2006

(65) Prior Publication Data
US 2007/0269293 A1 Nov. 22, 2007

Related U.S. Application Data

(60) Provisional application No. 60/747,445, filed on May 17, 2006.

(51) Int. Cl.
*B65B 1/04* (2006.01)
(52) U.S. Cl. .................. 141/63; 206/213.1; 206/711
(58) Field of Classification Search .............. 141/63, 141/98; 118/715; 206/711
See application file for complete search history.

(56) References Cited

U.S. PATENT DOCUMENTS

| | | | | |
|---|---|---|---|---|
| 5,320,218 A * | 6/1994 | Yamashita et al. | ....... | 206/213.1 |
| 5,561,915 A * | 10/1996 | Vandergriff | .................. | 34/201 |
| 5,575,081 A * | 11/1996 | Ludwig | ......................... | 34/218 |
| 5,806,574 A * | 9/1998 | Yamashita et al. | ............ | 141/63 |
| 6,093,082 A * | 7/2000 | Somekh | ......................... | 451/9 |
| 6,113,468 A * | 9/2000 | Natalicio | ...................... | 451/41 |
| 6,135,168 A * | 10/2000 | Yang et al. | .................... | 141/98 |
| 6,267,158 B1 * | 7/2001 | Saga | ............................ | 141/94 |
| 6,302,927 B1 * | 10/2001 | Tanigawa | ................... | 29/25.01 |
| 6,355,106 B1 * | 3/2002 | Zheng et al. | ................ | 118/697 |
| 6,368,411 B2 * | 4/2002 | Roberson et al. | ............ | 118/715 |
| 6,758,876 B2 * | 7/2004 | Suzuki et al. | .............. | 55/385.6 |
| 6,808,352 B2 * | 10/2004 | Seita | ....................... | 414/217.1 |
| 6,883,539 B2 * | 4/2005 | Inoue et al. | ............ | 137/565.23 |
| 6,926,029 B2 * | 8/2005 | Inoue et al. | ............ | 137/565.23 |
| 7,296,422 B2 * | 11/2007 | Strohm et al. | ................... | 62/78 |
| 2001/0041218 A1 * | 11/2001 | Cook et al. | ............. | 427/248.1 |
| 2002/0074664 A1 | 6/2002 | Nogami et al. | | |
| 2003/0213143 A1 * | 11/2003 | Shih et al. | ....................... | 34/72 |
| 2004/0074808 A1 * | 4/2004 | Bhattt | ........................ | 206/711 |
| 2005/0236271 A1 * | 10/2005 | Izu et al. | ..................... | 204/424 |

OTHER PUBLICATIONS

Eric Lebreton, "Confined Space", Transport Canada Canutec, pp. 1-5, at http://www.tc.gc.ca/canutec/en/articles/documents/confined.htm Mar. 28, 2006.

* cited by examiner

*Primary Examiner*—Charles A Fox
(74) *Attorney, Agent, or Firm*—Duane Morris LLP

(57) ABSTRACT

A carrier comprises an enclosure, a cabinet and at least one substrate holder. The enclosure comprises a door. The cabinet is coupled to the carrier. The cabinet comprises at least one valve and contains at least one reduction fluid. The substrate holder is disposed within the enclosure to support at least one substrate.

15 Claims, 9 Drawing Sheets

SUBSTRATE CARRIER AND FACILITY INTERFACE AND APPARATUS INCLUDING SAME

This application claims priority of the filing date of U.S. Provisional Patent Application No. 60/747,445 filed May 17, 2006, which provisional patent application is hereby formally incorporated by reference.

BACKGROUND OF THE INVENTION

1. Field of the Invention

The present invention relates to carriers and facility interfaces, and more particularly to semiconductor wafer carriers and facility interfaces.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed along with techniques for overcoming manufacturing obstacles associated with these materials and requirements.

FIG. 1 is a schematic drawing showing a traditional via hole structure. A copper layer 110 is formed over a substrate 100. An ultra low-k dielectric layer 120 is formed over the copper layer 110. A via hole 130 is formed within the ultra low-k dielectric layer 120 to expose the top surface of the copper layer 110. If the copper layer 110 is exposed to air, the top surface of the copper layer 110 reacts with oxygen in air, forming a copper oxide layer 140 due to oxidation. The copper oxide layer 140 can adversely affect the electrical connection between the top surface of the copper layer 110 and a conductive via plug filled into the via hole 130. In addition, the ultra low-k dielectric layer 120 absorbs moisture when exposed to air. Accordingly, great care should be taken to avoid exposure to air during critical process steps, such as via opening, formation of copper seed layers, copper chemical mechanical polish (CMP) and formation of the ultra low-k dielectric material.

Traditionally, after a critical process step, the substrate 100 is removed from the process chamber that performs the critical process step and temporarily stored in a cassette or front opening unified pod (FOUP) until subsequent processing. When the door of the cassette or FOUP is removed to allow placement of the substrate 100 in the cassette or FOUP, air from the surrounding environment including oxygen flows into the cassette or FOUP. After the door is closed, the air is sealed within the cassette or FOUP with the substrate 100. As described above, oxygen tends to react with the copper layer 110 formed over the substrate 100 to form the copper oxide layer 140.

In order to address this problem, a "Q-time" is required after a critical process step is performed in the semiconductor manufacturing process. The next substrate process must be performed within a set predetermined time period or Q-time, such as from 2 to 4 hours. If a subsequent process, such as formation of a barrier layer, does not occurred within the time period, a cleaning process is required to remove any copper oxide layer 140 formed over the copper layer 110.

Due to high integration of semiconductor devices over substrate 100, a semiconductor process usually has a plurality of the critical steps each with an associated Q-time designed to protect the substrate. These Q-time requirements complicate the manufacturing processes. In addition, if a Q-time is missed, additional steps such as cleaning steps increase process time and complexity.

By way of background, U.S. Pat. No. 6,506,009 provides a description of a prior art cassette stocker, the entirety of which is hereby incorporated by reference herein. U.S. Patent Publication No. 2003/0070960 provides a description of a prior art wafer cassette for storing and transporting wafers, the entirety of which is hereby incorporated by reference herein. Neither of these references provide a means for limiting formation of oxidation on or otherwise protecting surfaces of substrates when substrates are stored within or transferred to cassettes or FOUPs.

From the foregoing, improved cassettes or carriers and facility interfaces therefor are desired.

SUMMARY OF THE INVENTION

In accordance with some exemplary embodiments, a carrier comprises an enclosure, a cabinet and at least one substrate holder. The enclosure comprises a door. The cabinet is coupled to the carrier. The cabinet comprises at least one valve and contains at least one reduction fluid. The substrate holder is disposed within the enclosure to support at least one substrate.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
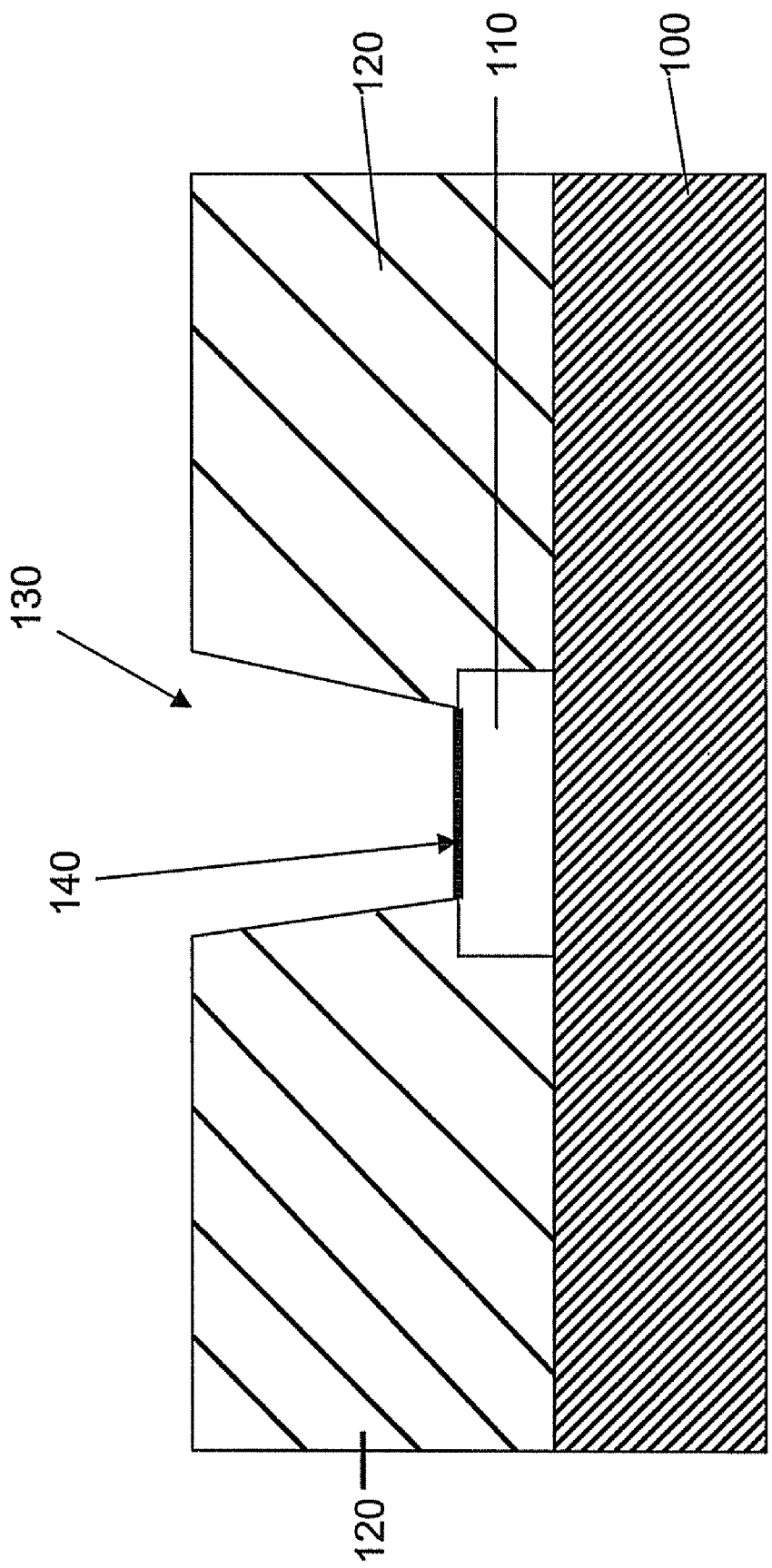
FIG. 1 is a schematic drawing showing a prior art via hole structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2A:
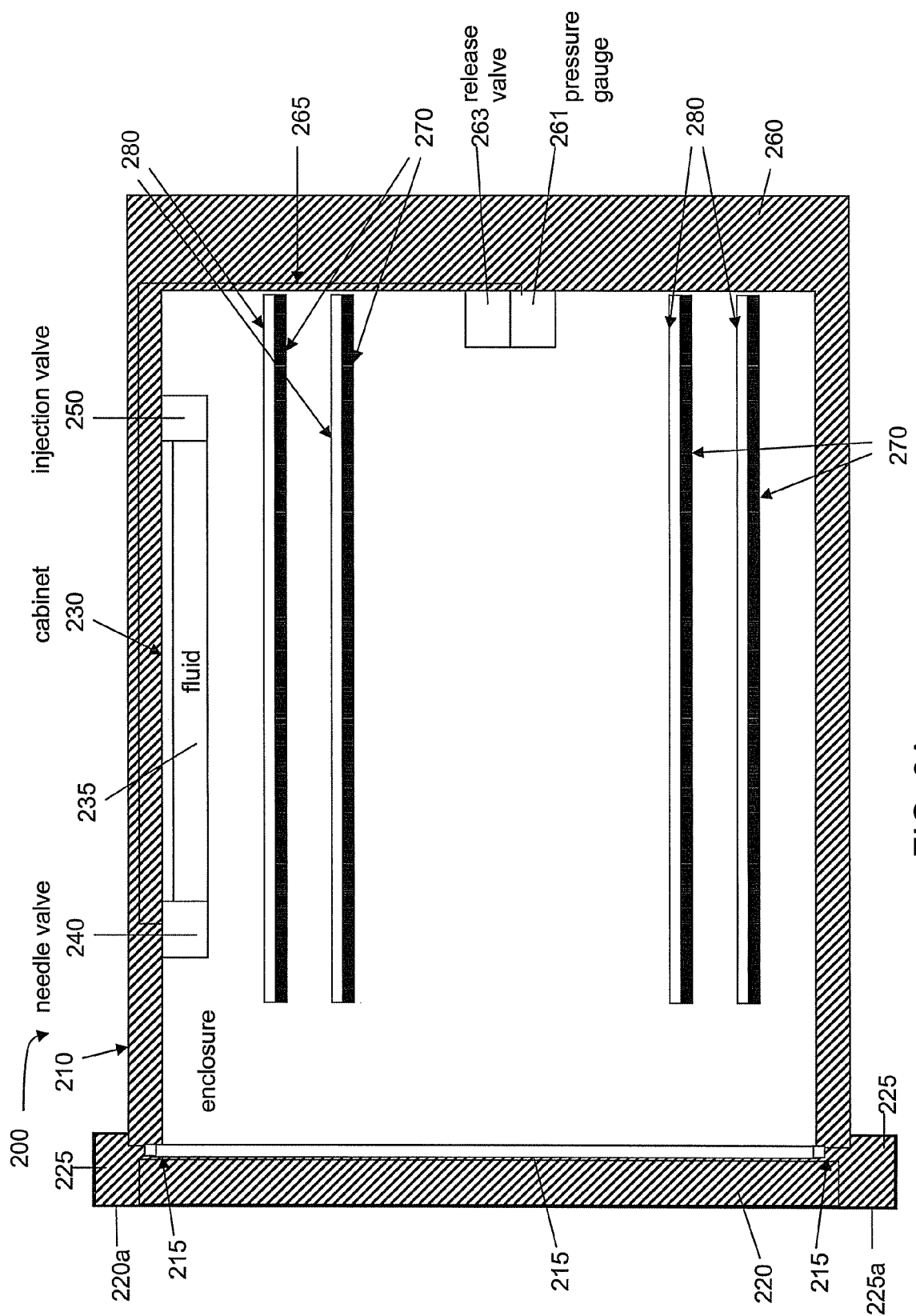
FIG. 2A is a schematic side cross-sectional view of an exemplary wafer carrier.

FIG. 2A is a schematic cross-sectional view of an exemplary wafer carrier. The carrier 200 comprises an enclosure 210 comprising a door 220 for opening and closing the enclosure 210. A hollow cabinet 230 is coupled to the carrier or formed integrally therein. The cabinet 230 can be, for example, a square, rectangular, oval or other shape that is adapted to store a fluid. FIG. 2A shows the cabinet 230 located proximate to a wall 260, such as the top wall, of the enclosure 210. In other embodiments, the cabinet 230 is located away from the door 220 so that the positioning of the cabinet 230 will not interfere transfer of substrates 280. The cabinet 230 can vertically or horizontally disposed on a sidewall, top wall or bottom wall of the carrier 230. In still other embodiments, the cabinet 230 can be disposed on the door 220. The cabinet 230, which is essentially a tank, contains at least one fluid 235 therein, shown partially filling cabinet 235. The cabinet 230 includes at least one valve, such as a valve 240 and an injection valve 250. At least one substrate holder 270 is disposed within the enclosure 210 and coupled to at least one of the walls 260 of the enclosure 210 to carry at least one wafer substrate, display substrate, such as liquid crystal display (LCD), plasma display, cathode ray tube display or electro luminescence (EL) lamp, light emitting diode (LED) substrate or reticle (collectively referred to as, substrate 280), for example.

The carrier 200 can be, for example, a cassette, front opening unified pod (FOUP), reticle carrier or other carrier known in the art for carrying one or more semiconductor substrate. In an embodiment, the carrier 200 is a FOUP and the door 220 is located on a side of the carrier 200. In this embodiment, the carrier 200 also includes a frame 225 so that the door 220 can be moved into and from the frame 225. Further, a surface 225a of the frame 225 is attached to a sealing apparatus disposed on a facility interface (not shown in FIG. 2A, but shown in FIG. 4B). In some embodiments, the carrier 200 is a cassette and the door 220 is located at the bottom of the carrier. In still other embodiments, the door 220 is located at the top of the carrier 200. The dimensions of the door 220 do not necessarily match the dimensions of a face of the enclosure 210 at which it is located as shown in FIG. 2A. For example, the enclosure 210 can comprise a sidewall 260 having an opening through which a substrate 280 can be placed. In this embodiment, the door 220 need only cover the opening. In some embodiments, the door 220 is configured within or coupled to the sidewall 260 so that it can move (e.g., slide or swing) to close and open the opening in the sidewall 260 of the enclosure 210. Alternatively, the door 220 can be removed. From the foregoing, it should be understood that the enclosure 210 need only include an opening having dimensions that allow the substrates 280 to be moved smoothly in and out of the enclosure 210 and a door 220 (i.e., cover) for covering the opening to seal the enclosure 210.

In the embodiment of FIG. 2A, the enclosure 210 is sealed when the door 220 is connected to or closed over the opening to the enclosure 210. In some embodiments, a sealing apparatus 215 is disposed between the enclosure 210 and the door 220 to seal the carrier 200 against a surface. The sealing apparatus 215 can be disposed on the enclosure 210, door 220 or both. The sealing apparatus 215 can be, for example, a rubber strip, O-ring, gel or other apparatus adapted to seal the carrier 200. In other embodiments, the sealing apparatus 215 is not required if the enclosure 210 and the door 220 are tightly connected, such as by fasteners.

The door 220 is removed or opened to transfer at least one substrate 280 into or from the enclosure 210. The enclosure 210 is connected to an interface apparatus (not shown) during the substrate transfer. The sealing apparatus 215 (on the enclosure 210 and/or interface apparatus) seals the gap between the enclosure 210 and the interface apparatus as described in more detail below. In some embodiments, it is possible that the substrate 280 is exposed to the environment when the door 220 is removed. The enclosure 210, however, is either immediately contacted with the interface apparatus or sealed by the door 220 after the transfer of the substrate 280. The duration of the substrate 280 exposure to the environment is short enough that little reaction can occur between the substrate 280 and the environment. In addition, in embodiments, a reduction gas is provided within the carrier 200 to reduce the oxidation as described below.

Referring to FIG. 2A, the pressure within the sealed carrier 200 is maintained higher than the pressure of the environment surrounding the carrier 200 in order to prevent or reduce gas flowing from environment into the carrier 200 during prolonged storage periods. For example, if the environmental pressure is about 1 atm, the pressure within the carrier 200 is maintained higher than 1 atm. Accordingly, the required pressure within the carrier 200 can vary with the environmental pressure. In some embodiments, the pressure within the carrier 200 is maintained within a selected range, such as from about 1.0 atm to about 2.5 atm. In some preferred embodiments, the pressure within the carrier 200 is maintained within a selected range, such as from 1.0 atm to about 1.3 atm, so that the pressure difference between the environment and the carrier 200 will not crash the carrier 200.

The desired pressure is maintained by a gas provided in the carrier 200. The gas can comprise a reduction gas, a gas that is non-reactive with the substrate 280 or a mixture thereof. A reduction gas can be provided to reduce or prevent oxide formation on the surfaces of the substrate 280 due to exposure of the substrate 280 during transfer of the substrate 280 into the carrier 200 or due to air trapped in the carrier 200. In some embodiments, the substrate 280 comprises exposed copper layers (not shown in FIG. 2A, but shown in FIG. 1) and the reduction gas comprises hydrogen ($H_2$), ammonia ($NH_3$), or other reduction gas or mixture thereof. The non-reactive gas component can comprise an inert gas such as helium (He), neon (Ne), argon (Ar), krypton (Kr), xenon (Xe), radon (Rn) or other gas such as nitrogen ($N_2$) that does not substantially react with the surfaces of the substrates 280 to form an oxide or other undesirable reaction (e.g., absorption of water within a low-k dielectric layer). In some embodiments, the non-reactive gas can be provided into the carrier 200 by a valve coupled to the carrier 200 and to an external source. In still other embodiments, the non-reactive gas may be provided into the carrier 200 from the cabinet 230 if the cabinet 230 comprises a mixture of the reduction fluid and non-reactive fluid or from a second cabinet (not shown).

The amount of the reduction gas should be controlled to prevent explosion or other volatility if the selected reduction gas is volatile. For example, if $H_2$ is the reduction chemical within the carrier 200, the amount of $H_2$ within the carrier 200 should be equal to, or less than, about 4% per volume. One preferred amount of $H_2$ is between about 10 parts per million (ppm) to about 4% per volume with the remaining percentage composed of at least one non-reactive gas. In some embodiments, if $NH_3$ is the reduction chemical within the carrier 200, the amount of $NH_3$ within the carrier 200 is equal to, or less than, about 15.5% per volume. One preferred amount of $NH_3$ is between about 10 parts per million (ppm) to about 15.5% per volume with the remaining percentage composed of at least one non-reactive gas.

In some embodiments, the sealing apparatus 215 does not completely seal the carrier 200 and the gas within the carrier 200 is allowed to leak or flow into the environment surrounding the carrier 200, at least in small amounts. If the gas is hazardous, such as $NH_3$, the gas within the carrier 200 is controlled so that the leakage of the gas does not result in levels harmful to human beings. For example, with $NH_3$ the levels should not be allowed to rise to 25 ppm in the environment. The amount of the gas, e.g., $NH_3$, within the carrier 200 may also be adjusted to eliminate this concern.

Referring to FIG. 2A, the cabinet 230 comprises at least one reduction fluid and/or non-reactive fluid 235 therein stored as a gas, liquid or both (collectively, "fluid"). The valve 240, which comprises a needle valve in an embodiment, releases a gas formed by the fluid 235 within the cabinet 230 into the carrier 200 when the pressure within the carrier 200 is at or lower level than a predetermined or measured pressure, for example, the environmental pressure (e.g., 1 atm). The injection valve 250 allows for filling the fluid 235 into the cabinet 230 when the amount of the fluid 235 within the cabinet 230 is lower than a predetermined or desired amount. In some embodiments, the fluid comprises a mixture of $N_2$ and $H_2$ in which $H_2$ is from of about 4% per volume to of about 10% per volume. In other embodiments, the fluid 235 is liquid $H_2$. Under the pressure within a range from about 1 atm to about 2.5 atm and at room temperature, $H_2$ is in a gas phase. Once liquid $H_2$ is released into this environment, it converts to the gas phase and fills into the enclosure 210 of the carrier 200. In embodiments, the gas of the fluid 235 can be filled into the enclosure 210 by an installed pump (not shown). In some embodiments, a pressure gauge 261 is coupled to the valve 240 by connection 265 to send a signal to trigger the valve 240 to release the reduction fluid gas. In other embodiments, the pressure gauge 261 is not required if the valve 240 is time set to release the gas of the fluid 235 or is itself pressure sensitive.

In some embodiments, a gauge (not shown) is coupled to, or installed in, the injection valve 250. This gauge senses the amount of the fluid 235 within the cabinet 230 and sends a signal to trigger the injection valve 250 to fill the fluid 235 into the cabinet 230 from a source such as an external fluid tank (not shown) if the amount of the fluid 235 within the cabinet 230 is less than a predetermined amount. Alternatively, the gauge is not required if, for example, the injection valve 250 is time set to fill the fluid 235 into the cabinet 230 or itself serves as a gauge.

In some embodiments, only one of the valves 240 and 250 is used if the selected valve is configured to allow both the injection of the reduction fluid 235 into the cabinet and the release of the gas of the reduction fluid 235 into the enclosure 210 under the conditions described above.

In some embodiments, the cabinet 230 is not required if fluid 235 is filled directly into the enclosure 210 from an external source through a valve.

If a pump is not provided, in order to speed delivery of the gas into enclosure 210, the cabinet 230 is disposed at a top region of the enclosure 210 when the molecular weight of the fluid 235 is larger than the molecular weight of the gas within the carrier 200. For example, assume that the fluid 235 is $NH_3$ and the gas within the carrier 200 is a mixture of $NH_3$ and He. The molecular weight of $NH_3$ is 17 and the molecular weight of He is 2. If the gas comprises 10% $NH_3$ and 90% He, the molecular weight of the gas is about 3.5, which is less than 17. Thus, the cabinet 230 is disposed at the top region of the enclosure 210 so that $NH_3$ efficiently diffuses into the enclosure 210 when the valve 240 is actuated. In contrast, the cabinet 230 is disposed at a bottom region of the enclosure 210 if the molecular weight of the fluid 235 is less than the molecular weight of the gas within the carrier 200. For example, assume that the fluid 235 comprises $H_2$ and the gas within the carrier 200 comprises a mixture of $H_2$ and nitrogen. The molecular weight of $H_2$ is 2 and the molecular weight of nitrogen is 28. If the gas comprises 1% $H_2$ and 99% nitrogen, the molecular weight of the gas is about 27.74, which is larger than 2. Therefore, the gas of the fluid 235 within the cabinet 230 disposed at the bottom region of the enclosure 210 efficiently diffuses into the enclosure 210 when the valve 240 is actuated. Note that the "top region" is not limited to the top wall 260 as shown in FIG. 2A. The top region can be the top portion of the sidewall 260 of the enclosure 210. Also, the bottom region can be the bottom portion of the sidewall 260 of the enclosure 210.

The configuration of the cabinet 230 is not strictly required as described above. The gas released from the fluid 235 can uniformly diffuse within the enclosure 210 if there is sufficient time for the gas to diffuse. If the gas diffuses within the enclosure 210 in a manner that effectively prevents oxidation or other chemical reactions with the substrate 280, the cabinet 230 can be disposed at any desired location.

In some embodiments, transfer of the substrate 280 is performed within an environment such that air will not flow into the enclosure 210 when the door 220 is removed. In this embodiment, the fluid 235 can be, for example, a fluid of a non-reactive gas to the substrate 280 (e.g., an inert gas or nitrogen) without need for the reduction fluid.

Again referring to FIG. 2A, in one embodiment, the pressure gauge 261 and the release valve 263 are disposed on the sidewall 260 of the enclosure 210. The pressure gauge 261 is adapted to sense the pressure within the carrier 200. The release valve 263 is adapted to adjust the pressure within the carrier 200 when the pressure within the carrier 200 is higher than a desired pressure limit, such as about 2.5 atm. Adjusting the pressure within the carrier 200 can prevent potential explosions resulting from a volatile reduction gas within the carrier 200 as described above. In some embodiments, the pressure gauge 261 senses the pressures within and outside the carrier 200. If the pressure within the carrier 200 is higher than the pressure outside the carrier 200 by a certain amount, the pressure gauge 261 sends a signal to the valve 263 to trigger release of at least some of gas within the carrier 200.

In some embodiments, the release valve 263 comprises a spring (not shown) which has a mechanical property such that the pressure within the carrier 200 presses the spring to open the release valve 263. For those embodiments, the pressure gauge 261 is not required as the release valve 263 is pressure sensitive and configured as needed. In other embodiments, the release valve 263 comprises a piezoelectric material which has a material property such that the pressure within the carrier 200 presses the piezoelectric material to generate a signal to turn on the release valve 263. For this embodiment, the pressure gauge 261 is also not required though it can still be coupled to the valve 240.

Referring to FIG. 2A, the walls 260 of the enclosure 210 comprise one or more than one substrate holders 270. The substrate holders 270 are provided to support the substrates 280. The substrate holders 270 can be, for example, plates, small extrusions on or grooves within the walls 260 or other holding structures capable of holding the substrate 280.

Figure 2B:
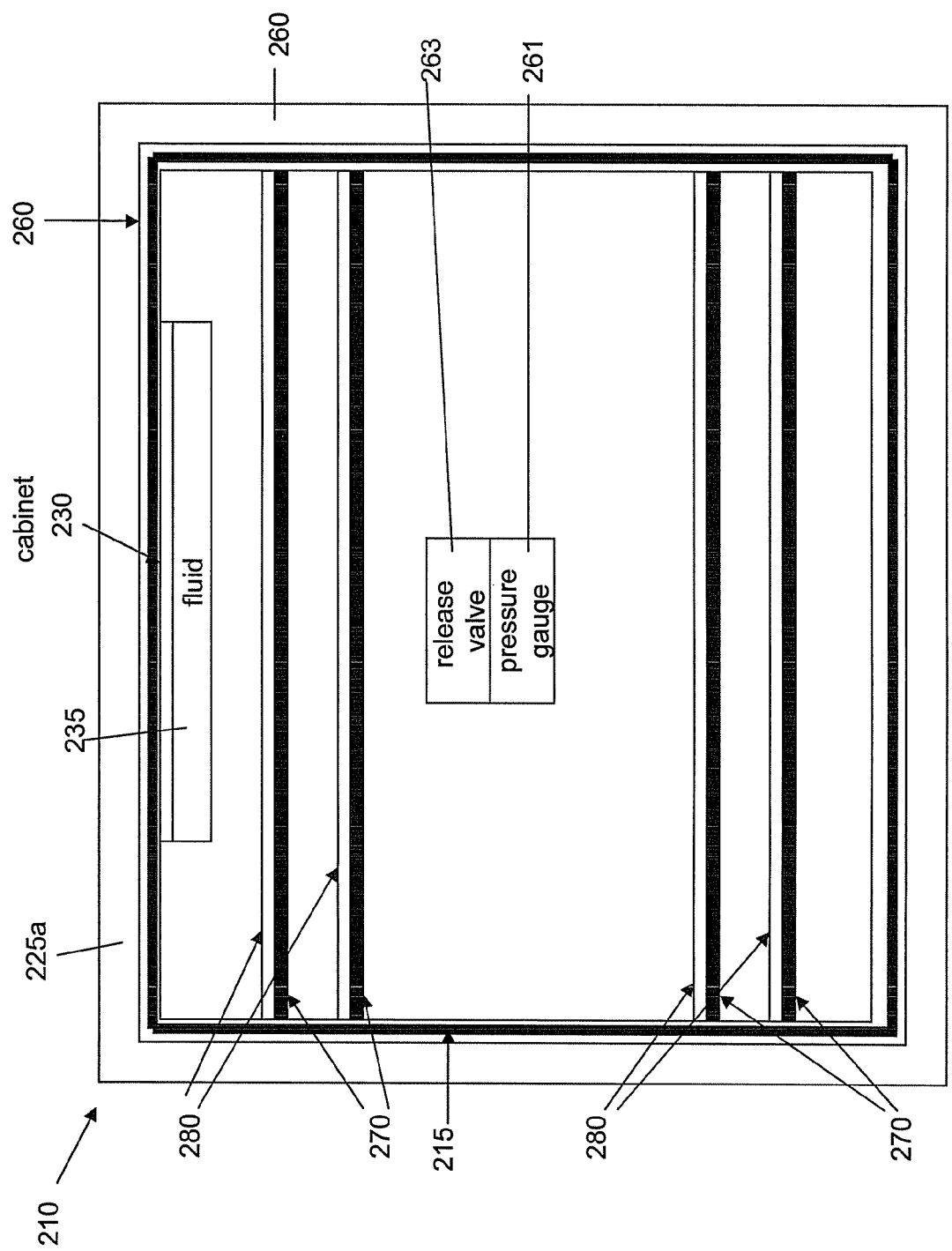
FIG. 2B is a schematic end view of the carrier of FIG. 2A shown with the door of the carrier removed.

FIG. 2B is a schematic end view of an exemplary carrier 200 shown with the door 220 of the carrier 200 removed. In FIG. 2B like items are indicated by like reference numbers as in FIG. 2A. In this view, the sealing apparatus 215 can be seen disposed around the opening of the enclosure 210.

Figure 3A:
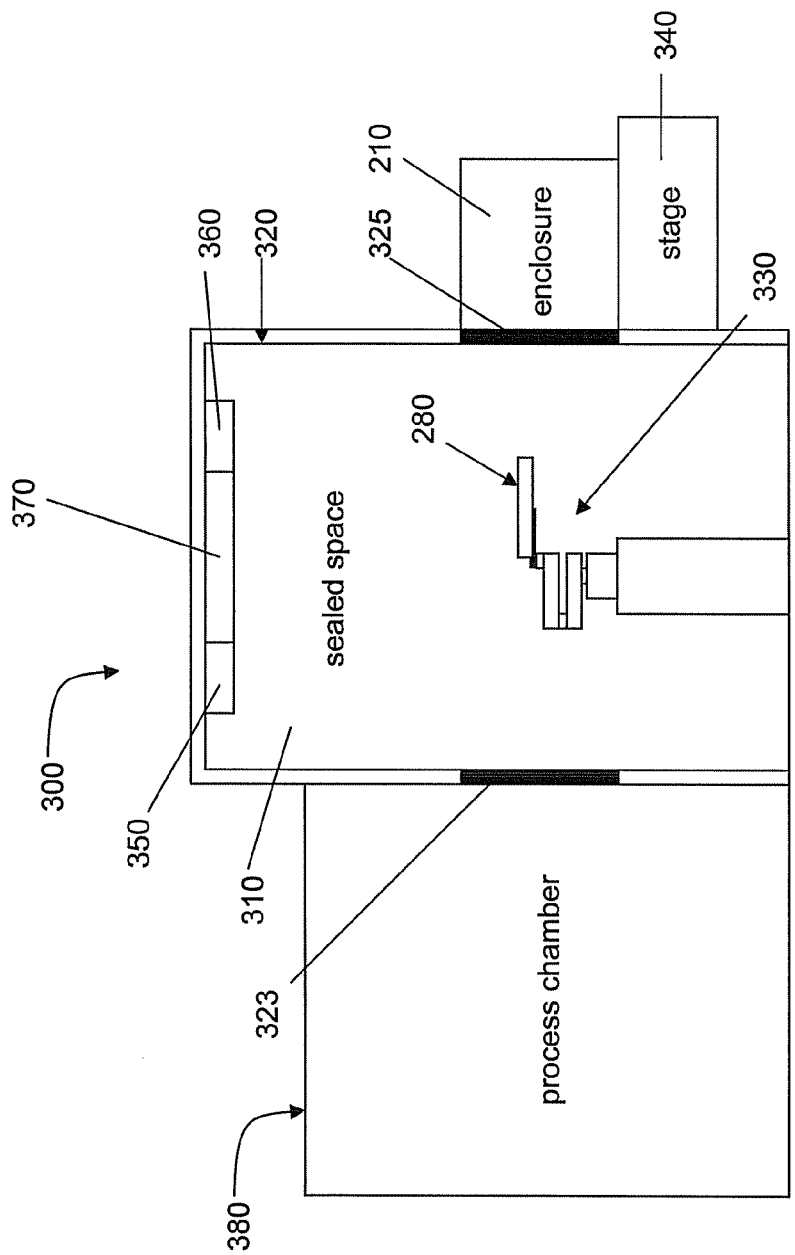
FIG. 3A is a schematic illustration of an exemplary facility interface.

FIG. 3A is a schematic cross-sectional view of an exemplary facility interface system. The facility interface system comprises an enclosure 300. The enclosure 300 comprises a sealed space 310 having a gas therein and at least one door 325 on or in at least one of the walls 320 of the enclosure 300.

The gas comprises a gas as described above in connection with the description of carrier 200, e.g., a reduction gas, non-reactive gas or mixture thereof. At least one robot 330 is disposed within the enclosure 300. At least one stage 340 is disposed outside of the sealed space 310 and on or proximate to an outer surface of one of the walls 320 of the enclosure 300 proximate to the door 325 for supporting the enclosure 210. Optionally, the enclosure 210 can be directly coupled to and be supported by the wall 320 of the enclosure 300. The door 325 is provided so that the substrates 280 stored in the enclosure 210 can be properly transferred between the enclosure 210 and the facility interface. At least one valve is provided for the enclosure 300. In some embodiments, the enclosure 300 includes a valve 350 and a release valve 360. A pressure gauge 370 may be coupled to the valves 350 and 360. The robot 350 operates to transfer the substrate 280 between the carrier 200 and the process chamber 380 through the doors 323 and 325.

The pressure within the enclosure 300 is maintained higher than the pressure of the environment surrounding the enclosure 300 through cooperation of the valves 350 and 360 and gauge 370 in order to prevent or reduce gas flow from the environment into the enclosure 300. For example, if the environmental pressure is about 1 atm, the pressure within the enclosure 300 is maintained higher than about 1 atm. Accordingly, the pressure within the enclosure 300 can vary with the environmental pressure. In some embodiments, the pressure within the enclosure 300 is from about 1.0 atm to about 2.5 atm. The enclosure 300 includes a gas therein including at least one of a reduction gas and a non-reactive gas with respect to the substrate 280 as described above in connection with the enclosure 210. The reduction gas is provided to reduce or prevent oxidation on the surfaces of the substrates 280 and its levels are controlled as described above in connection with the carrier 200.

In some embodiments, the enclosure 300 is connected to a process or transfer chamber 380. A process chamber 380 can be, for example, a wet chemical plating bench, a dry etch chamber for via opening, a chamber for formation of a copper seed layer, a chamber for copper chemical mechanical polish (CMP), a chamber for formation of low-k dielectric material or other chamber which forms or exposes material on the substrate that may react if exposed to the environment.

Referring to FIG. 3A, the valve 350 and the exhaustion valve 360 are disposed on one of the walls 360 of the enclosure 300. The valve 350 injects the mixture gas including the reduction gas into the enclosure 300 from a source (not shown) to adjust the pressure therein when a pressure within the enclosure 300 is lower than a predetermined pressure, such as about 1 atm. In some embodiments, the gas introduced by the valve 350 comprises a mixture of $N_2$ and $H_2$ in which $H_2$ is from of about 4% per volume to of about 10% per volume. The exhaustion valve 360 exhausts the gas from the enclosure 300 to adjust the pressure therein when the pressure within the enclosure 300 is higher than another predetermined pressure, such as about 2.5 atm. Rather than utilizing both valves 350 and 360, in some embodiments, only one valve 350 or 360 is used. In such embodiments, the valve 350 or 360 injects the mixture gas comprising the reduction gas into the enclosure 300 when the pressure within the enclosure 300 is lower than a predetermined pressure, such as 1 about atm, and exhausts the mixture gas comprising the reduction gas from the enclosure 300 when the pressure within the enclosure 300 is higher than another predetermined pressure, such as about 2.5 atm. In some embodiments, the valve 350 and/or the exhaustion valve 360 is coupled to a mass flow controller (MFS) (not shown) to control the flow of the gas into and out from the enclosure 310, respectively.

In some embodiments, a pressure gauge 370 is coupled to the valve 350, exhaustion valve 360 or both so that the pressure gauge 370 sends a signal to trigger the valve 350 to inject the mixture gas including the reduction gas into the enclosure 300 and the exhaustion valve 360 to exhaust the mixture gas including the reduction gas from the enclosure 300 when the measured pressure reaches predetermined limits. In other embodiments, the pressure gauge 370 is not required if the valve 350 and the exhaustion valve 360 are time set to inject and exhaust the mixture gas comprising the reduction gas, respectively, or the valves are pressure sensitive or include integral gauges.

In some embodiments, the pressure gauge 370 senses the pressures within and outside the enclosure 300. If the pressure within the enclosure 300 is higher than the pressure outside the enclosure 300 by a predetermined amount, the pressure gauge 370 sends a signal to trigger the exhaustion valve 360 to release the gas within the enclosure 300 until the desired pressure differential is reached.

In some embodiments, only the reduction gas, rather than the mixture gas, is injected into the enclosure 300 by the valve 350. However, the pressure and volume percentage of the mixture gas within the enclosure should be maintained in such a way as described above. If the conditions of the mixture gas within the enclosure 300 can be substantially maintained as described above, the injection of the reduction gas is acceptable. Factors for consideration in locating the valves 350 and 360 are described above in connection with the carrier 200 and can be applied to the enclosure 300.

Figure 3B:
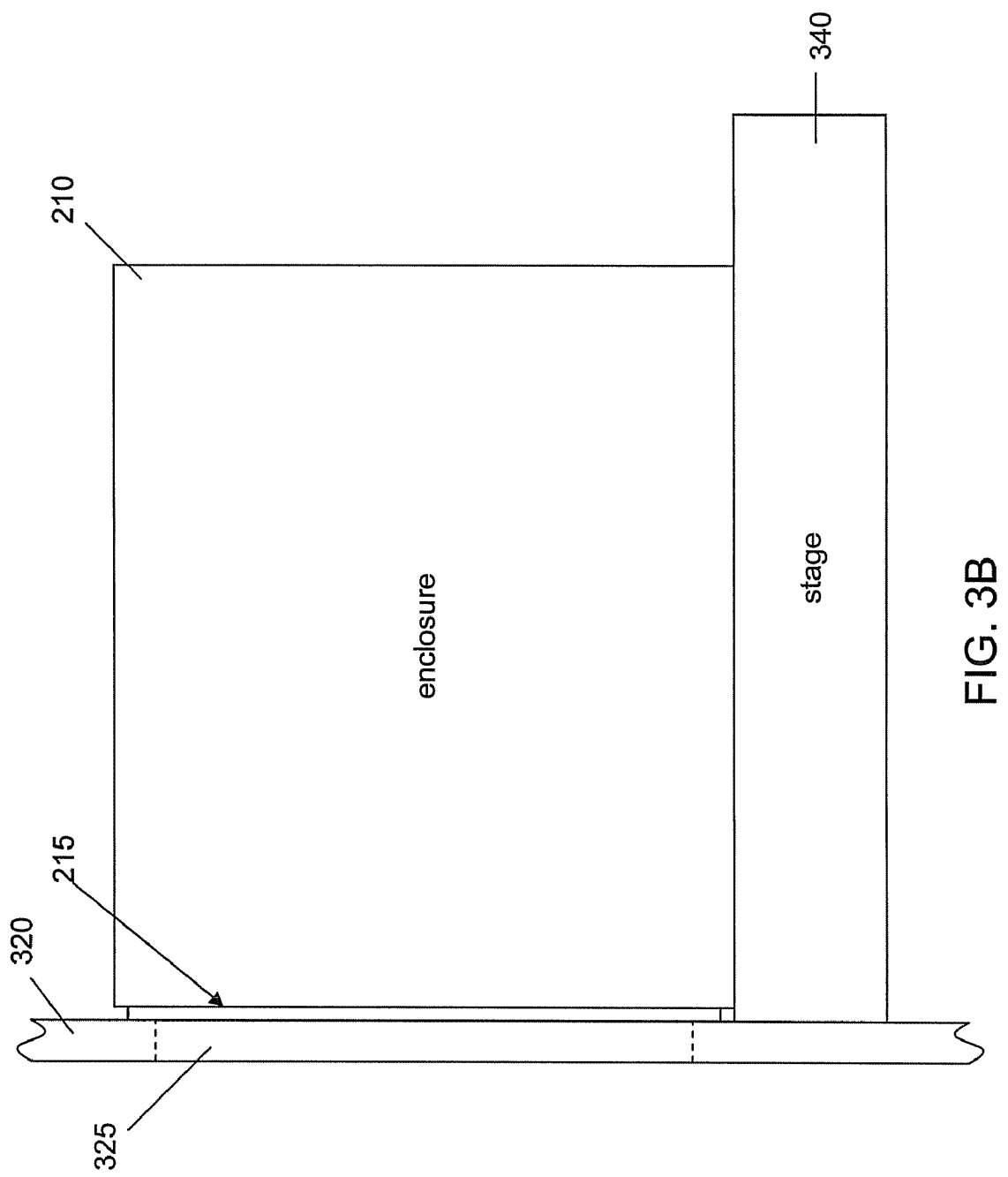
FIG. 3B is an enlarged drawing of the stage, carrier, sealing apparatus and wall of the enclosure shown in FIG. 3A.

FIG. 3B is an enlarged, partial view of the stage 340, enclosure 210, sealing apparatus 215 and wall 320 of the enclosure 300 shown in FIG. 3A. After the door 220 of the carrier 200 is removed, the door 325 on the wall 320 is opened so that the substrates 280 can be transferred between the enclosure 210 and the facility interface by the robot 330. The enclosure 210 is connected to the wall 320. The sealing apparatus 215 seals the enclosure 210 against the wall 320 of the enclosure 300. In some embodiments, the pressure and gas conditions within the enclosure 300 are substantially similar to those within the carrier 200. In other embodiments, they can be different as long as such difference does not cause a chemical reaction on the surface of the substrate 280.

Again referring to FIG. 3A, after the substrate 280 is removed from the enclosure 210 into the enclosure 300, the door 323 between the process chamber 380 and the enclosure 300 is opened. The substrate 280 is then transferred into the process chamber 380 for processing, and the door 323 between the process chamber 380 and the enclosure 300 is closed. After the processing, the substrate 280 is transferred from the process chamber 380 into the enclosure 300. The condition within the process chamber 380 may be different from that within the enclosure 300, and the opening of the door 323 between the process chamber 380 and the enclosure 300 may destroy the desired condition within the enclosure 300. However, the valve 350 and the release valve 360 are able to promptly recover the condition within the enclosure 300 back to a desired condition as described above after closing of the door 323 between the process chamber 380 and the enclosure 300. The time to recover such condition may be in the order of tens of seconds, which is short enough such that, for example, any oxidation occurring on the surface of the substrate 280 is negligible, i.e., will not adversely affect the connection between the surface of the copper layer 110 and a conductive via plug filled within the via hole 130 as shown in FIG. 1.

Figure 4A:
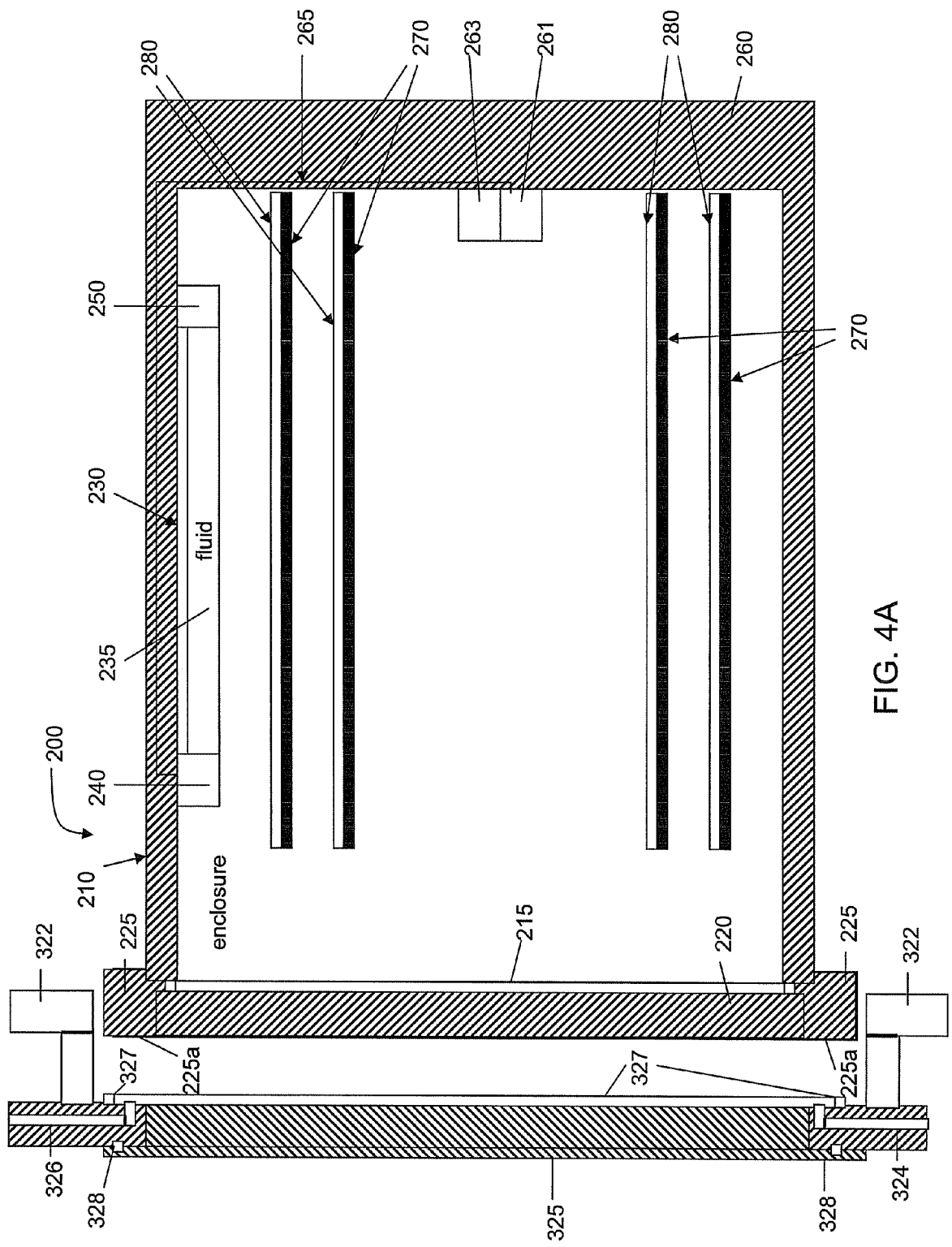
FIGS. 4A-4C are schematic cross-sectional views illustrating an exemplary process of attaching the carrier 200 to the facility interface 300 as shown in FIG. 3B.
Figure 4B:
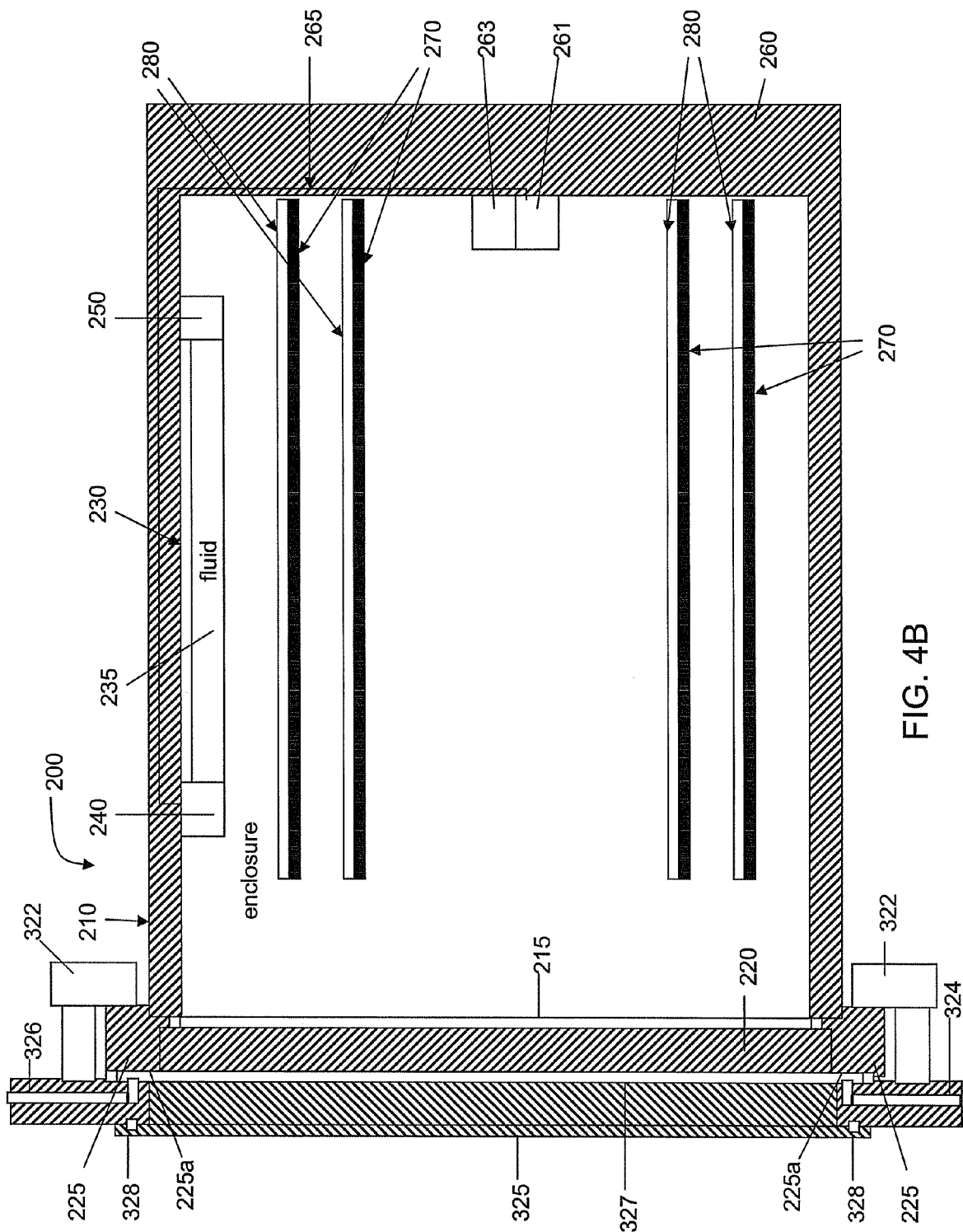
Figure 4C:
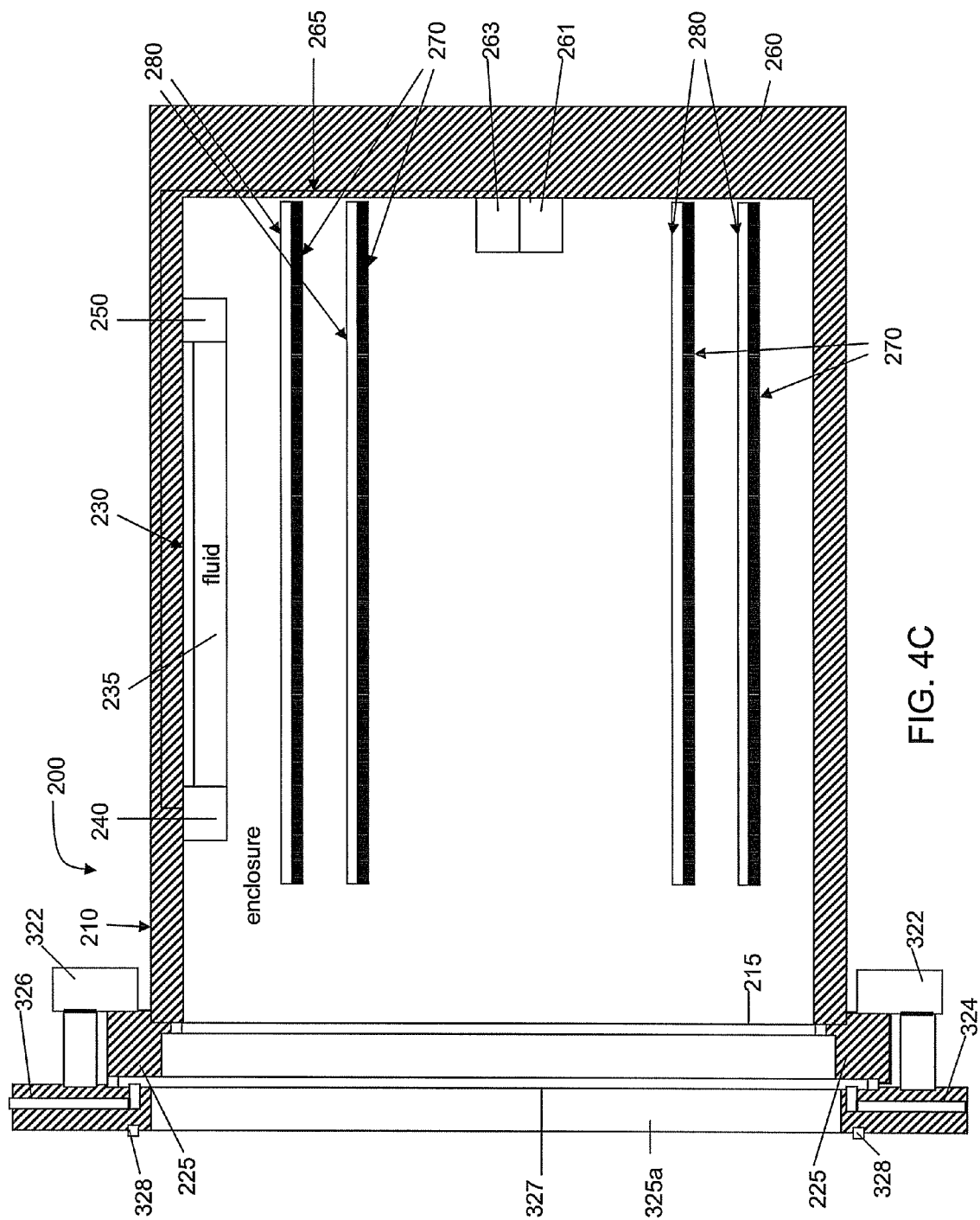

FIGS. 4A-4C are schematic cross-sectional views illustrating an exemplary process of attaching the carrier 200 to the facility interface 300 as shown in FIG. 3B.

Referring to FIG. 4A, the carrier 200 is moved approached to a wall 310a of the enclosure 310. The wall 310a of the enclosure 310 includes the door 325, which is configured to cover an opening into the enclosure 310. A sealing apparatus 328, such as a rubber strip, O-ring, gel or other apparatus adapted to seal the enclosure 310, is disposed on the inner surface of the wall 310a and between the wall 310a and the door 325 so that the door 325 can be attached to the wall 310a to tightly seal the enclosure 310. In some embodiments, the sealing apparatus 328 is disposed on the door 325 at the periphery area surrounding the opening 325a (shown in FIG. 4C). The outer surface of the wall 310a includes another sealing apparatus 327, such as a rubber strip, O-ring, gel or other apparatus adapted to seal the region between the doors 220 and 325 after the attachment of the carrier 200 and the wall 310a. The sealing apparatus 327 is adapted to seal the gap between the frame 225 of the carrier 200 to the wall 310a, when the door 220 is attached to the wall 310a as shown in FIG. 4B. In some embodiments, the sealing apparatus is disposed on the surface 225a of the frame 225 surrounding the opening 325a (show in FIG. 4C).

At least one fasteners 322, such as clamps, knob clamps, clips or other devices that can fasten the carrier 200 to the wall 310a, are configured on the outer surface of the wall 310a proximate to edges of the sealing apparatus 327 to fasten the carrier 200, such as the frame 225. The fasteners 322 can be, for example, rotated or vertically moved to fasten the carrier 200. The number of the fasteners 322 is not limited to the number shown in FIG. 4A. It can be one or more than one fasteners 322 as long as the carrier 200 can be fastened to the wall 310a.

At least one valves, such as a valve 324 and a valve 326, configured within the wall 310a. The opening of the valves 324 and 326 are configured within an area enclosed by the sealing apparatus 327 to remove air from a region sealed by the sealing apparatus 327 as shown in FIG. 4B and inject an inert gas or a mixture including the reduction gas as set forth above into the region, respectively. In some embodiments, only one of the valves 324 and 326 is used if the selected valve is configured to allow both the removal of the air from the region sealed by the sealing apparatus 327 and the injection of an inert gas or a mixture gas including the reduction gas into the region. In some embodiments, the valves 324 and/or 326 are coupled to at least one mass flow controllers (MFC) to control the removal rate of air and the injection rate of the inert gas or the mixture gas.

Referring to FIG. 4B, the carrier 200 is attached to the wall 310a, such as the sealing apparatus 327. Under this embodiment, the surface 225a of the frame 225 is attached against the sealing apparatus 327 so that the sealing apparatus tightly seals the gap between the doors 215 and 325. The valve 324 then removes air trapped within the region sealed by the sealing apparatus 327. The valve 326 then injects the inert gas or the mixture gas within this region so that this region is filled with the gas so that does not substantially react with the substrates 280 stored in the carrier 200. In some embodiments, the cycle of the removal of the air and the injection of the inert gas or mixture gas is performed at least one times, such as about 3-5 times, so that the air trapped within this region sealed by the sealing apparatus 327 is substantially removed.

Referring to FIG. 4C, the doors 325 and 220 are sequentially removed to locations that will not interfere the transfer of the substrates 280. The locations can be, for example, proximate to the inner surface of the wall 310a and below the opening 325a that is covered by the door 325. In addition, the dimension of the door 220 is smaller than that of the door 325. The door 220 thus can be removed towards the enclosure 310 after the removal of the door 325. As described above, the enclosure 310 and the carrier 200 contain the gas including the reduction gas. Further, the air trapped within the region sealed by the sealing apparatus 327 and the inert gas or mixture gas is then injected into this region. Accordingly, the substrates 280 can be transferred between the enclosure 310 and the carrier 200 without substantial exposure to air. The present invention, however, is not limited thereto. The transfer of the substrates 280 can still be performed as set forth in connection with FIG. 3A, for example.

Figure 5A:
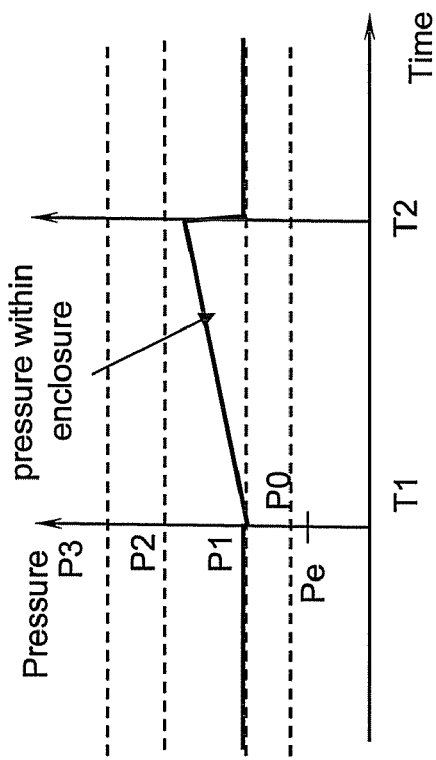
FIGS. 5A-5B are schematic drawings showing exemplary pressure changes within an enclosure after loading and unloading of the enclosure on a stage.
Figure 5B:
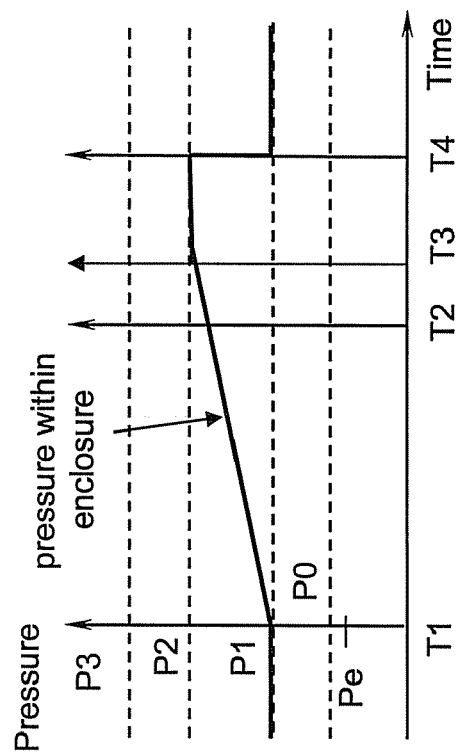

FIGS. 5A-5B are plots showing a pressure change within the enclosure 210 during an unloading/transfer/reloading cycle of the carrier 200 from the stage 340.

Referring to FIG. 5A, Pe represents the pressure of the environment surrounding the enclosure 210, P0 represents a low-level pressure, P1 represents the selected pressure within the enclosure 300 of the facility interface, P2 represents the minimum desired pressure within the enclosure 200 and P3 represents the maximum desired pressure within the enclosure 210. In some embodiments, if either the pressure of the enclosure 310 or the carrier 200 is lower than P0, it is assumed that leakage of the gas occurs between the environment and the enclosure 310 and/or the carrier 200. The enclosure 310 and/or the carrier 200 thus can be checked before the use of transferring and carrying the substrates 280.

Prior to T1, the enclosure 210 is seated on the stage 340 and physically coupled to the enclosure 300 with the door 220 opened or removed and with the door 325 opened as shown in FIG. 3B. Because the spaces within the enclosures 210 and 300 are connected, the pressure within the enclosure 210 is substantially equal to the pressure within the enclosure 300, e.g., P1. After one or more substrates 280 are transferred to the carrier 200, at the time T1, the door 220 is attached to or closed over the carrier 200 to seal the enclosure 210 as shown in FIG. 2A. The carrier 200 is lifted from the stage 340 and transported to a selected processing apparatus during time between times T1 to time T2. In this embodiment, the desired minimum pressure P2 within the enclosure 210 is higher than the environment pressure Pe and the pressure P1 maintained within the enclosure 300. In order to increase the pressure within the enclosure 210 to the desired minimum pressure P2, the valve 240 shown in FIG. 2A operates to release the gas of the fluid 235 stored within the cabinet 230 into the enclosure 210 to increase the pressure. At the time T2, in order to perform a subsequent process, the enclosure 210 is reloaded, i.e., seated, on a stage 340 of a facility interface associated with a second process apparatus and the door 220 is removed. The enclosure 210 is physically coupled to an enclosure 300 as shown in FIG. 3B. FIG. 5A shows that the time between T1 and T2 was not long enough to allow the pressure within the enclosure 210 to reach the desired minimum pressure P2. At time T2, because the spaces within the enclosures 210 and 300 are connected and the space within the enclosure 300 is substantially larger than that within the enclosure 210, the pressure within the enclosure 210 is pulled down and maintained substantially equal to the pressure P1 within the enclosure 300.

The timeline of FIG. 5B shows the operation of the carrier 200 when sufficient time passes from a time T1 (where the carrier 200 is unloaded from a facility interface) for the pressure within the carrier 200 to reach the desired minimum pressure P2. From time T1 to time T4, substrates 280 are stored and/or transported within the carrier 200. At time T3, the pressure reaches the desired minimum pressure P2, and from time T3 to T4 the pressure is maintained within the desired pressure range (P2 to P3) by operation of valves 240, 250, 263, pressure gauge 261 and/or cabinet 230. At time T4, the carrier 200 is again loaded onto a stage of a facility interface. The door 220 of the carrier 200 is opened or removed and the carrier 200 is coupled to an enclosure 300, at which time the pressure equalizes with the pressure P1 of the enclosure 300.

In still other embodiments, after the door 220 is closed, the valve 240 injects the reduction gas into the carrier 200. The release valve 263, such as a spring, releases the gas within the carrier 200 to the environment if the pressure within the carrier 200 is higher than P2 without the use of the pressure gauge 261.

Although FIGS. 5A-5B illustrate the operation of embodiments where P1 is less than P2, in some embodiments, the desired pressure to be maintained within the enclosure 210 is substantially equal to the pressure within the enclosure 310. In still other embodiments, the desired pressure to be maintained within the enclosure 210 is lower than the pressure within the enclosure 310 but above the environment pressure Pe.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A carrier, comprising:
    an enclosure comprising a plurality of walls and a door;
    a cabinet coupled to the carrier within the enclosure, the cabinet comprising a valve and containing a fluid; wherein the valve is operable to introduce said fluid into said enclosure, and the fluid is selected from the group consisting of a reduction fluid and a non-reactive fluid; and
    a substrate holder disposed within the enclosure to support a substrate.

2. The carrier of claim 1, wherein the pressure within the carrier is maintained at a pressure higher than the pressure of the environment surrounding the carrier.

3. The carrier of claim 2, further comprising means for maintaining the pressure within the carrier within a selected pressure range.

4. The carrier of claim 3, wherein the selected pressure range is from about 1.0 atm to about 2.5 atm.

5. The carrier of claim 1, further comprising a sealing apparatus disposed between the enclosure and the door to seal the carrier when the door is in a closed position, and to seal the enclosure and an interface apparatus when the door is in an open position or removed.

6. The carrier of claim 1, wherein the cabinet comprises a first valve and a second valve, the second valve positioned to allow release of a gas of the fluid into the enclosure when a pressure within the enclosure is lower than a predetermined pressure level, and the first valve is positioned to allow filling of the fluid into the cabinet.

7. The carrier of claim 6, wherein the predetermined pressure level is about 1 atm.

8. The carrier of claim 1, wherein the reduction fluid comprises a mixture of hydrogen ($H_2$) and ammonia ($NH_3$), and the mixture is in gas or liquid form.

9. The carrier of claim 8, wherein the cabinet is disposed proximate to a bottom region of the enclosure and a molecular weight of the reduction fluid is less than a molecular weight of a gas within the carrier, or the cabinet is disposed at a top region of the enclosure and the molecular weight of the reduction fluid is more than the molecular weight of the gas within the carrier.

10. The carrier of claim 1 further comprising a gas within the enclosure, wherein the gas comprises a reduction gas or a non-reactive gas with respect to a surface of the substrate.

11. The carrier of claim 10, wherein the reduction gas comprises at least one of hydrogen and ammonia, and the non-reactive gas comprises at least one of an inert gas and nitrogen.

12. The carrier of claim 11, wherein hydrogen is equal to or less than about 4% per volume and ammonia is equal to or less than about 15.5% per volume.

13. The carrier of claim 1 further comprising a release valve within the enclosure, the release valve being actuated to adjust a pressure within the carrier if the pressure is higher than a predetermined pressure level.

14. The carrier of claim 13, wherein the predetermined pressure level is about 2.5 atm.

15. The carrier of claim 13 further comprising a pressure gauge coupled to the release valve.

* * * * *